United States Patent [19]
Laskaris

[11] Patent Number: 5,153,546
[45] Date of Patent: Oct. 6, 1992

[54] OPEN MRI MAGNET

[75] Inventor: Evangelos T. Laskaris, Schenectady, N.Y.

[73] Assignee: General Electric Company, Schenectady, N.Y.

[21] Appl. No.: 709,528

[22] Filed: Jun. 3, 1991

[51] Int. Cl.⁵ .......................... H01F 1/00; H01F 7/00; H01F 3/00; G01V 3/00
[52] U.S. Cl. .................................. 335/216; 335/296; 335/298; 324/318
[58] Field of Search ................................ 335/209–214, 335/216, 219, 296, 297, 298, 299, 300, 301, 304; 315/5.35; 324/318, 319, 320, 321; 128/653 SC, 653 R, 653 CA, 653 A, ; 505/892, 893

[56] References Cited
U.S. PATENT DOCUMENTS 4,875,485 10/1989 Matsutani .......................... 128/653
5,008,624 4/1991 Yoshida ............................. 324/318

Primary Examiner—Leo P. Picard
Assistant Examiner—Ramon M. Barrera
Attorney, Agent, or Firm—James R. McDaniel; Paul R. Webb, II

[57] ABSTRACT

In an open MRI magnet, the magnet is capable of being rotated such that a patient can be imaged while either lying down or standing up. The open MRI magnet is rotated about a pivot located upon a pedestal.

11 Claims, 4 Drawing Sheets

OPEN MRI MAGNET

CROSS REFERENCE TO RELATED APPLICATIONS

The present invention is related to commonly assigned U.S. patent application Ser. No. 07/709,527 (RD-21,230), entitled "VIBRATION ISOLATION OF SUPERCONDUCTING MAGNETS".

BACKGROUND OF THE INVENTION

This invention relates to magnetic resonance imaging, hereinafter referred to as MRI, magnets of the type that have magnet coil pair assemblies which are set apart from each other to provide a clear or open gap between the coil pair assemblies. Structures of this type generally allow patients to be imaged by the MRI magnet while either standing up or lying down such that imaging can be performed faster and the patient is less likely to experience claustrophobia.

DESCRIPTION OF THE RELATED ART

It is known, in prior MRI magnets, to make use of an imaging system which allows the patient to be imaged while either standing up or lying down. Exemplary of such a prior MRI magnet is U.S. Pat. No. 4,924,198, which is assigned to the same assignee as the present application. However, while it is advantageous to be able to image patients while they are in a variety of positions, the magnet must be constructed such that the patients are capable of entering the magnet and being imaged quickly such that the patients should not experience any claustrophobia while being imaged. In particular, U.S. Pat. No. 4,924,198 employs supports which provide a gap between the coil pairs. The supports are needed in order to provide adequate structural strength for the coil pairs. However, the imaging process could be quickened especially when the imaging is being done on a patient who is standing up, if the patient could simply walk into an open area between the coil pairs instead of having to walk around the supports. Also, just prior to or while the patient is being imaged, if the patient did not see the supports, possibly any anxiety or claustrophobia the patient may have, would be eliminated. Consequently, a more advantageous system, then, would be presented if such amounts of imaging time and possible patient anxiety or claustrophobia could be reduced.

It is apparent from the above that there exists a need in the art for an MRI magnet which is open, and which at least equals the safety and performance characteristics of the known MRI magnets, but which at the same time allows the patient to be imaged quicker while substantially avoiding patient fears associated with enclosed diagnostic equipment. It is a purpose of this invention to fulfill this and other needs in the art in a manner more apparent to the skilled artisan once given the following disclosure.

SUMMARY OF THE INVENTION

Generally speaking, this invention fulfills these needs by providing an open MRI magnet, comprising a support means having a pivot connection means, a pair of superconductive coil assemblies substantially located at a distance from each other to provide a gap between said assemblies, and a coil assembly support means rigidly attached to said coil assemblies and having a pivot means such that said pivot means contacts and rotates in said pivot connection means.

In certain preferred embodiments, the coil assemblies and the coil assembly support means are evacuated. Also, the pivot connection means includes a Gifford-McMahon cryorefrigerator. Finally, the pivot means is constructed of three concentric tubes.

In another further preferred embodiment, the patient is capable of quickly being scanned while either standing up or lying down such that substantially all the patient's fears associated with being placed within an enclosed diagnostic device are eliminated.

The preferred MRI magnet, according to this invention, offers the following advantages: decreased imaging time; excellent stability; good durability, good economy; high strength for safety; and easy magnet orientation. In fact, in many of the preferred embodiments, these factors of imaging time and magnet orientation are optimized to an extent considerably higher than heretofore achieved in prior, known MRI magnets.

BRIEF DESCRIPTION OF THE DRAWINGS

The above and other features of the present invention, which will become more apparent as the description proceeds, are best understood by considering the following detailed description in conjunction with the accompanying drawings wherein like characters represent like parts throughout the several views in which.

DETAILED DESCRIPTION OF THE INVENTION

Figure 1:
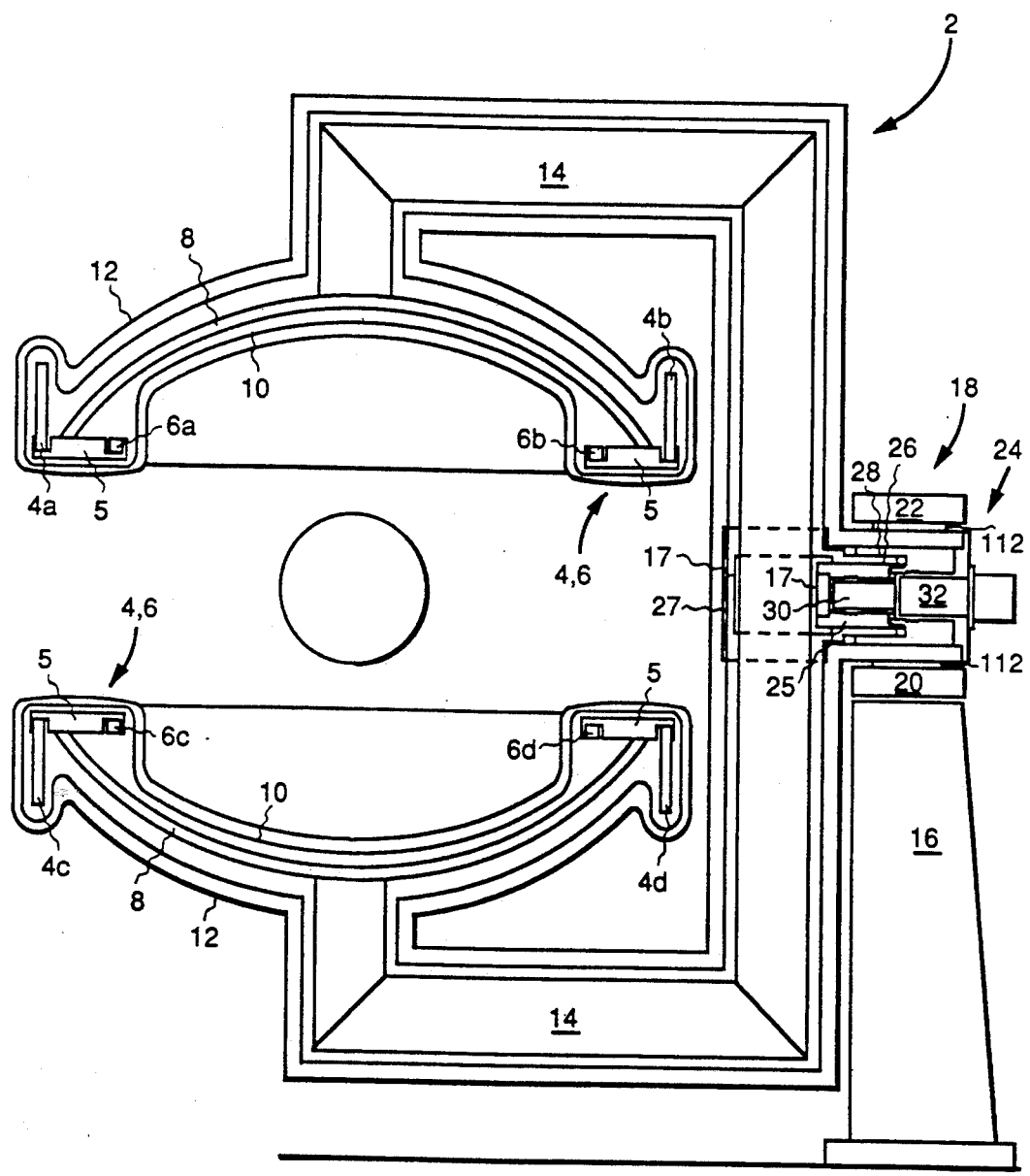
FIG. 1 is a schematic illustration of an open MRI magnet, according to the present invention.
Figure 4A:
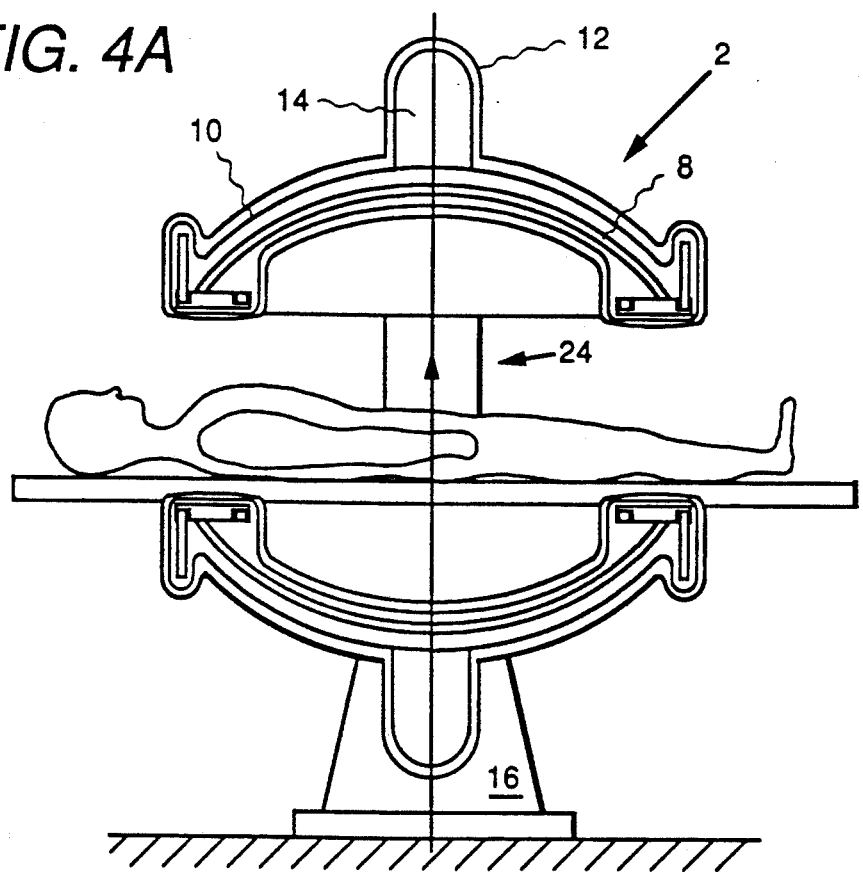
FIGS. 4a and 4b are schematic illustrations of the open MRI magnet with the patient being imaged while lying down and standing up, respectively.

With reference first to FIG. 1, open MRI magnet 2 is illustrated. Magnet 2 includes conventional resin impregnated, superconductive coils 4,6, support ring 5, spherical shell 8, thermal radiation shield 10, vacuum vessel envelope 12, C-shaped structural member 14, pedestal 16, connector 17, pivot 18, hard contact 19, pivot supports 20, 22 and cryocooler 24. In particular, support ring 5 and shell 8 are, preferably, constructed of aluminum and are employed to provide uniform heat conduction between for example, coils 4a, 6a and 4b, 6b, respectively. Radiation shield 10, preferably, is constructed of aluminum and is used to conduct heat from vacuum vessel envelope 12 to cryocooler 24. Envelope 12, preferably, is constructed of non-magnetic stainless steel, hereinafter referred to as NMSS, and is used to provide an evacuated atmosphere for coils 4, 6, supports 5, shell 8, shield 10 and member 14. Member 14, preferably, is C-shaped in order to provide adequate structural strength for magnet 2 while still allowing an open gap between, for example, respective coil pairs 4a, 6a and 4c, 6c so that the patient can be imaged while either lying down or standing up (FIG. 4). Support 27 and connector 17, preferably, are constructed of aluminum and rigidly attached to shield 10 and member 14, respectively, by welding. Hard contact 19, preferably is constructed of copper and is rigidly attached to connector 17 by bolting.

Pivot 18 is rigidly connected to envelope 12, such that envelope 12 is capable of being rotated about supports 20, 22 on pedestal 16 and supports 20, 22, preferably, are constructed of NMSS. Pivot 18 also includes a conventional Gifford-McMahon cryocooler 24, having stages 30, 32 and three concentric tubes 25, 26, 28. Tube 25, preferably, is constructed of copper. Tube 26, preferably, is constructed of any suitable carbon graphite material. Tube 28, preferably, is constructed of any suitable cloth-based or filamentwound fiberglass material.

Figure 2:
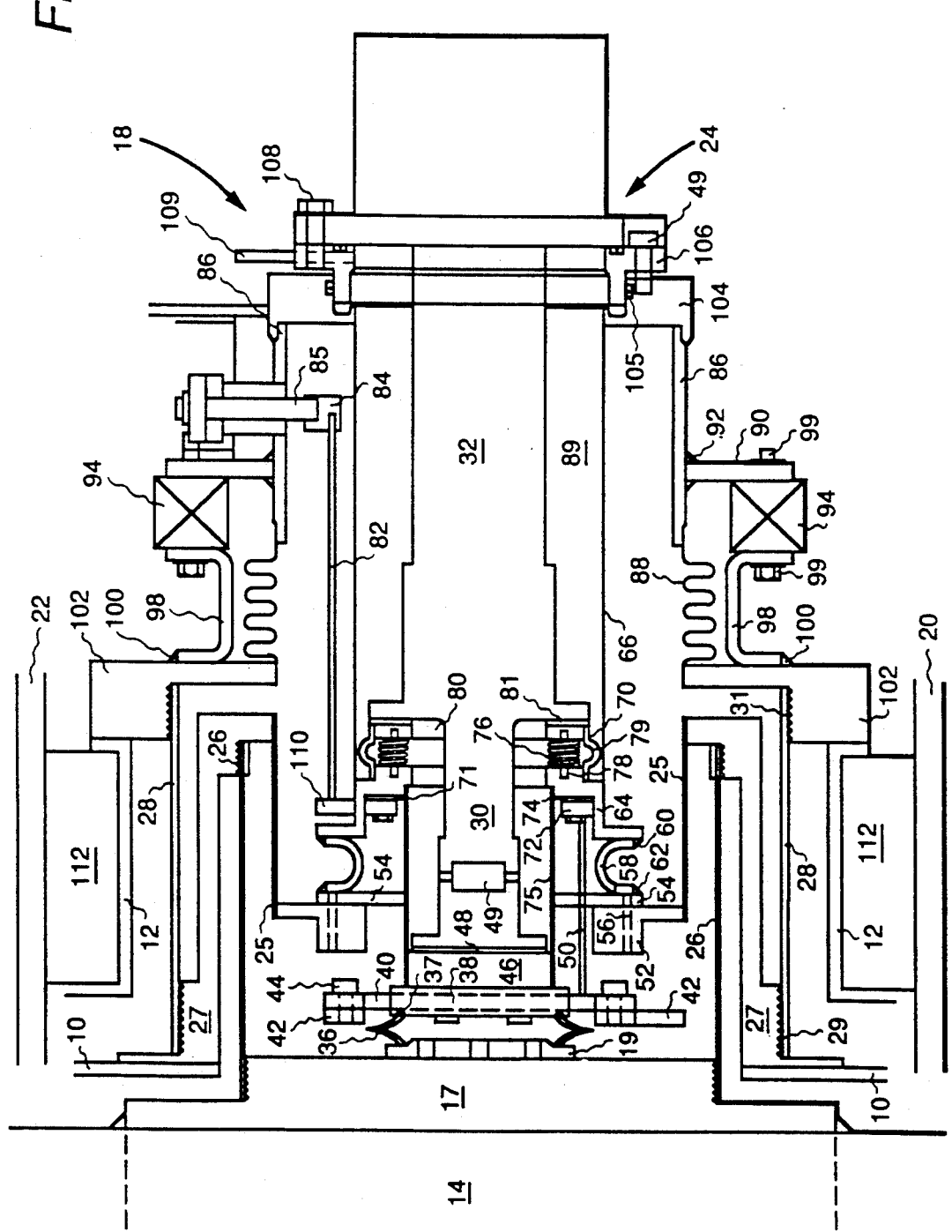
FIG. 2 is a detailed side plan view of the pivot and the pivot connection as outlined by the dotted area in FIG. 1.

With respect to FIG. 2, the details of pivot 18 and cryocooler 24 are more clearly illustrated. In particular, shield 10, which is maintained at approximately 40K, is rigidly attached, preferably, by welding to support 27. Also, hard contact 19 which is maintained at approximately 10K, is rigidly attached, preferably, by bolting to connector 17. Tube 26, preferably, is constructed of any suitable carbon graphite composite material while connector 17 is, preferably, constructed of aluminum. One end of tube 26 is rigidly attached to support 27, preferably, by adhesively bonded threads The other end of tube 26 is rigidly attached to connector 17, preferably, by adhesively bonded threads.

Located on top of hard contact 19 are V-shaped flexible members 36. Flexible members 36, preferably, are constructed of any suitable copper laminate and are preferably welded to hard contact 46. Hard contact 46, preferably, is constructed of copper. Traversing hard contact 46 are rods 40. Rods 40, preferably, are constructed of copper. Rods 40, preferably, are fastened to support plate 46 by insulated fasteners. Ceramic insulators with indium gaskets on either side are used to separate rods 40 from hard contact 46. Electrical bus bars 42 are rigidly fastened to rods 40 by conventional fasteners 44. Gasket 48 is rigidly attached to the top of hard contact 46. Gasket 48, preferably, is constructed of indium.

Stage 30, preferably, contacts gasket 48 such that stage 30 rests upon hard contact 46 and is rigidly attached to contact 46 by conventional fasteners 49. Stage 32, preferably, contacts gasket 81 such that stage 32 rests upon bracket 80. Gasket 81, preferably, is constructed of indium while bracket 80, preferably, is constructed of copper. Bracket 80 is rigidly connected to bellevue washer assembly 76 by a conventional fastener 78 such that washer assembly 76 provides compression between bracket 80 and bracket 64. Flexible copper laminates 79 are welded on one end to bracket 60 and the other end to bracket 64. Bracket 64, preferably, is constructed of copper and is, preferably, brazed to one end of support 75. The other end of support 75, preferably, is brazed to hard contact 46. Gaskets 74 which are, preferably, constructed of indium are located on either side of ceramic insulator 71 that separates bracket 64 from bus bar 72. One end of power lead 50 is rigidly attached to one end of bus bar 72. Bus bar 72 and power lead 50, preferably, are constructed of copper. The other end of power lead 50, preferably, is soldered to rod 40.

Located along one end of bracket 64 is one end of thermal connector 58. Connector 58, preferably, is constructed of any suitable copper laminate and is rigidly retained on bracket 64 by weldment 60. The other end of connector 58, preferably, is rigidly attached by weldment 62 to flange 54. Flange 54, preferably, is constructed of copper. Thermal station 52, preferably, is rigidly attached to flange 54 by a conventional fastener 56. Thermal station 52, which is, preferably, constructed of aluminum is rigidly connected by welding to one end of tube 25. Tube 25, preferably, is constructed of aluminum and its other end is welded to support 27. Located along support 27 is tube 28. Tube 28, preferably, is constructed of any suitable cloth-based or filament-wound fiberglass material and is rigidly attached at one end to support 27 by adhesive by bonded threads 29. The other end of tube 28, preferably, is adhered to bracket 102 by adhesively bonded threads 31.

Bracket 102, preferably, is constructed of NMSS and is rigidly attached to envelope 12 by welding. One end of bellows 88, preferably, is welded to bracket 102. Bellows 88, preferably, are constructed of NMSS. Located along bracket 102 is one end of bracket 98. Bracket 98, preferably, is constructed of NMSS and is rigidly attached to bracket 102 by weldment 100. The other end of bracket 98 is rigidly attached to one end of mount 94 by conventional fastener 99. Mount 94, preferably, is constructed of rubber and the other end of mount 94, preferably, is rigidly attached to one end of bracket 90 by fastener 99. Bracket 90, preferably, is constructed of NMSS and is rigidly attached to thermal connector 86 by weldments 92. Thermal connector 86, preferably, is constructed of NMSS such that one end is welded to the other end of bellows 88. The other end of connector 86, preferably, is welded to flange 104.

Flange 104, preferably, is constructed of NMSS and is welded to one end of thermal connector 66 and sealed against flange connector 106 by a conventional o-ring 105. Flange connector 106, preferably, is constructed of NMSS and is rigidly connected to cryocooler 24 by conventional fasteners 108.

Power lead 82 which is, preferably, constructed of copper is soldered at one end to extension 110 and the other end to bracket 84. Bracket 84 and extension 110, preferably, are constructed of copper. Bracket 84, preferably is soldered to one end of ceramic feed through 85. Ceramic feed through 85, is rigidly attached to thermal connector 86. Space 89 is evacuated by port 109 and well-known getter 49, thermally attached to cryocooler stage 30, absorbs any residual gases to maintain the vacuum in space 39. Getter 49, typically, is constructed of activated charcoal.

Located along pivot supports 20, 22 (FIG. 1) are conventional roller bearings 112. Bearings 112 contact envelope 12 near the area where envelop 12 is rigidly attached to bracket 102 so that magnet 2 is capable of being rotated in pivot 18. With respect to FIG. 3, the thermal connection between shield 10 and member 14 and pivot 18 can be seen. In particular, member 14 includes connector 17 which is rigidly attached to member 14. Connector 17, preferably, is maintained at a temperature of approximately 10K. because it is in intimate contact with member 14. It is to be understood that while only a portion of connector 17 is shown, connector 17 completely encircles member 14 to provide adequate heat transfer to connector 17. Connector 17 is rigidly and thermally attached to tube 26 which provides a thermal isolation path from connector 17 to vacuum envelope 12. Shield 10 includes support 27 which is rigidly attached to shield 10. Support 27, preferably, is maintained at a temperature of approximately 40K. because it is in intimate contact with stage 32 of cryocooler 24. It is to be understood that while only a portion of support 27 is shown, support 27 completely encircles shield 10 to provide adequate heat transfer to support 27. Support 27 is rigidly and thermally attached to tube 25 which provides a heat transfer path from support 27 to stage 32 of cryocooler 24. Support 27 is rigidly and thermally attached to tube 28 which thermally isolates support 27 from vacuum envelope 12.

Figure 3:
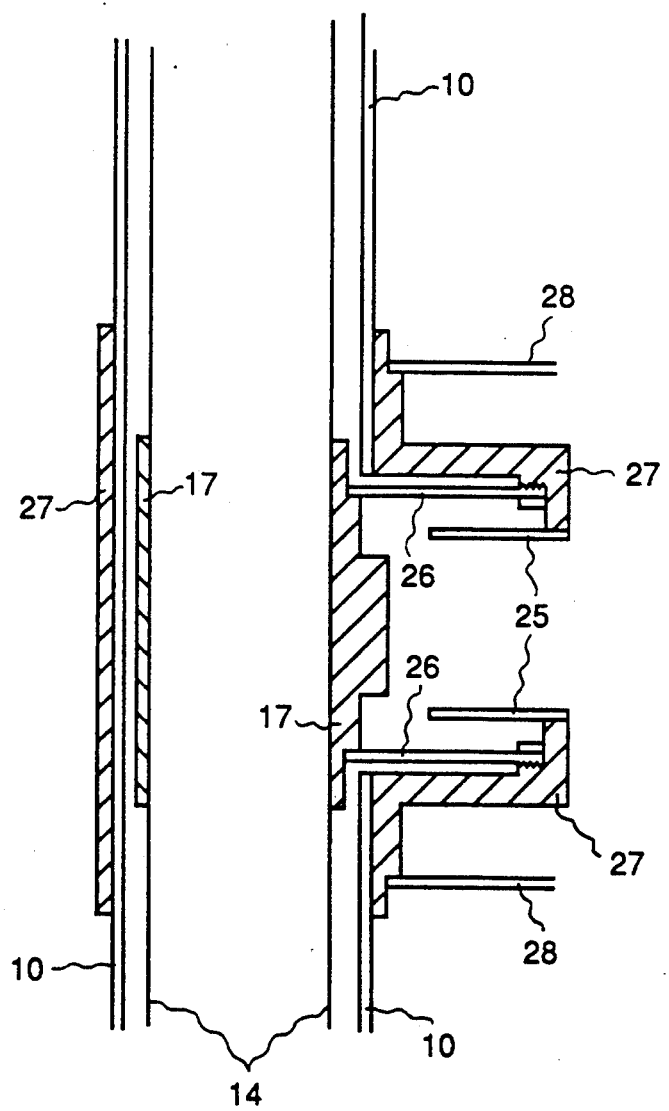
FIG. 3 is a detailed side plan view of the dotted area in FIG. 1.

In operation, when it is desired to, for example, image a patient lying down (FIG. 4a), the patient is placed in a supine position in magnet 2 and the magnet is turned on to produce a magnetic field of about 0.3 to 0.5 Telsa on a 30 cm volume with approximately a 30 ppm inhomogeneity. During this imaging process, heat is transferred from shield 10 and member 14 back to cryocooler 24. In particular, heat from shield 10 is conducted along shield 10 to support 27 where the heat is then conducted to tube 28 and, eventually is dissipated in cryocooler 24 (FIG. 3). Heat from member 14 is conducted along member 14 to connector 17 where the heat is then conducted to hard contact 19 to V-shaped flexible members 36 and, eventually is dissipated in cryocooler 24 (FIG. 3).

Figure 4B:
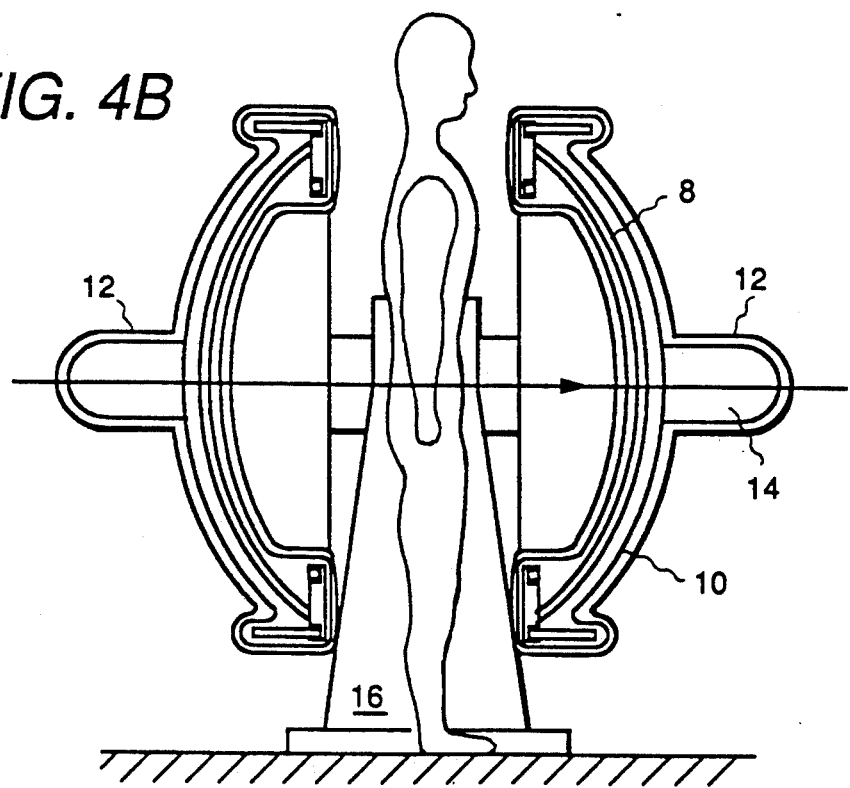

In order to image the patient while standing up, the operator merely rotates magnet 2 so that envelope 12 rotates about roller bearings 112, until magnet 2 is the position indicated in FIG. 4b. At this point, the patient can easily walk into magnet 2 and be imaged and the likelihood of the patient experiencing and fears of claustrophobia should be eliminated. The heat transfer operation and imaging characteristics in magnet 2 as depicted in FIG. 4b are the same as described with respect to FIG. 4a.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. An open MRI magnet which is comprised of:
   a support means being a pivot connection means;
   a pair of superconductive coil assemblies substantially located at a distance from each other to provide a gap between said assemblies, said coil assemblies are further comprised of at least two superconductor coils, a support ring means rigidly attached to and spanning said coils, a shell means rigidly attached to said support ring means, and a thermal shield means; and
   a coil assembly support means rigidly attached to said coil assemblies and having a pivot means such that said pivot means contacts and rotates in said pivot connection means.

2. The open MRI magnet, according to claim 1, wherein said support means is further comprised of:
   a pedestal means.

3. The open MRI magnet, according to claim 1, wherein said coil assembly support means is further comprised of:
   a C-shaped structural member means rigidly attached to said shell means; and
   an envelope means.

4. The open MRI magnet, according to claim 1, wherein said pivot means is further comprised of:
   a bearing means;
   an envelope means contacting and rotating on said bearing means;
   a heat conduction means rigidly attached at one end to said thermal shield means and rigidly attached at the other end to a cryocooler; and
   a vibration adsorption means.

5. The open MRI magnet, according to claim 3, wherein said pivot means is further comprised of:
   a bearing means;
   said envelope means contacting and rotating on said bearing means;
   a heat conduction means rigidly attached at one end to said structural member means and rigidly attached at the other end to a cryocooler; and
   a vibration absorption means.

6. The open MRI magnet, according to claim 1, wherein said magnet can be rotated such that a patient can be imaged while either lying down or standing up.

7. The open MRI magnet, according to claim 4, wherein said heat conduction means is further comprised of:
   at least one tube means.

8. The open MRI magnet, according to claim 5, wherein said heat conduction means is further comprised of:
   at least one tube means.

9. The open MRI magnet, according to claim 1, wherein said magnet operates over a range of about 0.3 to 0.5 Tesla with a 30 cm volume having approximately a 30 ppm inhomogeneity or better.

10. The open MRI magnet, according to claim 4, wherein said magnet receives heat from the environment while said magnet is operating such that said heat is conducted along said coils to said ring means to said shell means to said shield means to said heat conduction means and dissipates said heat to a cryocooler.

11. The open MRI magnet, according to claim 5, wherein said magnet receives heat from the environment while said magnet is operating such that said heat is conducted along said coils to said heat is conducted along said coils to said structural member means to said heat conduction means and dissipate said heat to a cryocooler.

* * * * *